United States Patent [19]
Niwayama

[11] Patent Number: 5,346,859
[45] Date of Patent: Sep. 13, 1994

[54] METHOD FOR FABRICATING A FULL PRESS-PACK TYPE SEMICONDUCTOR DEVICE

[75] Inventor: Kazuhiko Niwayama, Fukuoka, Japan

[73] Assignee: Mitsubishi Denki Kabushiki Kaisha, Tokyo, Japan

[21] Appl. No.: 125,836

[22] Filed: Sep. 24, 1993

Related U.S. Application Data

[62] Division of Ser. No. 888,656, May 27, 1992, Pat. No. 5,278,434.

[30] Foreign Application Priority Data

May 30, 1991 [JP] Japan ................. 3-127370

[51] Int. Cl.5 ........................................... H01L 21/60
[52] U.S. Cl. ................... 437/209; 437/211; 437/215; 437/217; 437/220
[58] Field of Search ............... 437/209, 211, 214, 215, 437/217, 219, 220; 257/181, 182, 688, 689

[56] References Cited

U.S. PATENT DOCUMENTS 3,581,160  5/1971  Piccone ............................ 437/216
4,694,322  4/1987  Sakurai et al. .................... 257/182
4,719,500  1/1988  Tokunoh .......................... 257/182
5,121,189  6/1992  Niwayama ........................ 257/181

Primary Examiner—Tom Thomas
Assistant Examiner—Kevin M. Picardat
Attorney, Agent, or Firm—Oblon, Spivak, McClelland, Maier & Neustadt

[57] ABSTRACT

Coned disc springs (84, 86) lie between a gate extracting electrode (80G) held in a ringlike recess (63) of an external cathode electrode (60K) and a bottom surface of the ringlike recess (63). A semiconductor body (30) is pressed against an anode distortion buffering plate (50A) by a urging force of the coned disc springs (84, 86) for vertical positional fixation of the semiconductor body (30). This enables the semiconductor body to be prevented from damages and deformation in a full press-pack type semiconductor device.

4 Claims, 4 Drawing Sheets

METHOD FOR FABRICATING A FULL PRESS-PACK TYPE SEMICONDUCTOR DEVICE

This is a division of application Ser. No. 07/888,656, filed on May 27, 1992, now U.S. Pat. No. 5,278,434.

BACKGROUND OF THE INVENTION

1. Field of the Invention

The present invention relates to a full press-pack type semiconductor device and a method of fabricating the same. More particularly, the invention relates to an improvement in a pressure engagement structure for the full press-pack type semiconductor device.

2. Description of the Background Art

A flat-pack type power semiconductor device is constructed such that a semiconductor body is sandwiched between upper and lower external electrodes. Such a semiconductor device, in which a large current flows through the semiconductor body, generates a large quantity of heat. When the external electrodes are brought into direct contact with the semiconductor body, there is generated a thermal stress between the external electrodes and the semiconductor body because they have different coefficients of thermal expansion, resulting in damage to the semiconductor body.

It is a customary practice to insert distortion buffering plates between the external electrodes and the semiconductor body so that the distortion buffering plates absorb the thermal stress. When the distortion buffering plates and the semiconductor body are joined together by soldering and the like, the thermal stress increases. Hence the full press-pack type semiconductor devices have found wide usage, in which electrical connection between the distortion buffering plates and the semiconductor body is held by only a geometrical contact therebetween.

FIG. 4 is an exploded sectional view of a conventional full press-pack type semiconductor device (diode module) disclosed in Japanese Patent Application Laid-Open No. 62-10927. The diode module 1 of FIG. 4 includes a semiconductor body 2, first and second distortion buffering plates 5, 6, an external anode electrode 10A and an external cathode electrode 10K. The diode module 1 is constructed such that the semiconductor body 2 is held under pressure between the external cathode electrode 10K and external anode electrode 10A through the first and second distortion buffering plates 5 and 6.

The semiconductor body 2 includes a discoid semiconductor substrate such as a silicon substrate in which at least one pn junction is formed. A cathode electrode (not shown) provided by metal deposition is formed on the upper surface of the semiconductor body 2, and an anode electrode (not shown) provided by metal deposition is formed on the lower surface thereof. A surface protective material 4 is applied to the peripheral edge of the semiconductor body 2 concentrically with the semiconductor body 2.

The conductive external anode and cathode electrodes 10A and 10K respectively include base portions 11A and 11K and projecting portions 12A and 12K formed integrally with the base portions 11A and 11K. Flanges 13A and 13K are fixed to the outer periphery of the base portions 11A and 11K, respectively.

The semiconductor body 2 is disposed above the projecting portion 12A of the external anode electrode 10A through the second conductive distortion buffering plate 6. A locating ring 8 is fitted over the projecting portion 12A, and the surface protective material 4 is fitted over the locating ring 8. This provides for the radial (lateral) positioning of the semiconductor body 2 relative to the external anode electrode 10A.

A casing 7 made of ceramic is of a cylindrical configuration. A flange 7a is fixed to the top end face of the casing 7, and a flange 7b is fixed to the bottom end face thereof. The casing 7 accommodates the semiconductor body 2 and other parts, and the flange 7b is fixedly brazed to the flange 13A of the external anode electrode 10A.

Inside the casing 7, the first conductive distortion buffering plate 5 is superimposed on the upper surface of the semiconductor body 2, and the projecting portion 12K of the external cathode electrode 10K is superimposed on the first distortion buffering plate 5. In this state, the flange 13K of the external cathode electrode 10K is fixedly brazed to the flange 7a of the casing 7.

The diode module 1 having such a construction, when used in a predetermined equipment, is inserted between anode and cathode members 15A and 15K of the predetermined equipment. The anode and cathode members 15A and 15K are urged in (+Z) and (−Z) directions, respectively, by an external spring not shown. The lower surface of the cathode member 15K comes into contact with the upper surface of the external cathode electrode 10K under pressure, and the upper surface of the anode member 15A comes into contact with the lower surface of the external anode electrode 10A under pressure. The pressures maintain electrical contact between the external cathode electrode 10K and semiconductor body 2 through the first distortion buffering plate 5 and electrical contact between the external anode electrode 10A and semiconductor body 2 through the second distortion buffering plate 6. When a voltage is applied across both members 15A and 15K in this state, a current flows from the cathode member 15K to the anode member 15A by way of the external cathode electrode 10K, first distortion buffering plate 5, semiconductor body 2, second distortion buffering plate 6, and external anode electrode 10A.

Heat generated from the semiconductor body 2 is dissipated through the distortion buffering plates 5, 6 and external electrodes 10K, 10A toward the members 15A and 15K.

The thermal stress generated between the external electrodes 10A, 10K and the semiconductor body 2 is absorbed by the distortion buffering plates 5, 6.

One of the problems to be solved with the full press-pack type semiconductor device is the positional fixation of the semiconductor body. Since the semiconductor body is not fixed to the casing in the full press-pack type semiconductor device, the semiconductor body is liable to position shifts. It is hence necessary to take measures against the position shifts.

In the conventional full press-pack type semiconductor device of FIG. 4, the lateral positioning of the semiconductor body 2 is intended by the fitting of the locating ring 8 and surface protective material 4. The device 1, however, takes no vertical positioning measures for the semiconductor body 2. The force to hold the semiconductor body 2 in between is transmitted from the external electrodes 10A and 10K, which are only fixed to the casing 7 through the flanges 13A and 13K, therefore the fixing force is relatively small.

The external electrodes 10K and 10A sometimes come up off the casing 7 due to the vibration of the semiconductor device 1 in transit. This causes decrease in the force to hold the semiconductor body 2 between the external electrodes 10K and 10A, accompanied by the formation of clearance between the external electrodes 10K, 10A, distortion buffering plates 5, 6 and semiconductor body 2. The further vibration, if continuously applied, causes the semiconductor body 2 and distortion buffering plates 5, 6 to vibrate independently between the external electrodes 10K and 10A. The semiconductor body 2 repeatedly collides against the distortion buffering plates 5 and 6, so that the semiconductor body 2 is damaged.

When the semiconductor body 2 is pressed upwardly due to the vibration in transit with the clearance formed above the semiconductor body 2, the surface protective material 4 applied to the peripheral edge of the semiconductor body 2 slips off the locating ring 8 from the top end. The position of the semiconductor body 2 is shifted also laterally, so that the characteristics of the device deteriorates.

It is not only the semiconductor device of FIG. 4 that has these problems. The problems are common to the full press-pack type semiconductor devices in which the semiconductor body and the members disposed above and below the semiconductor body are not fixed to each other.

SUMMARY OF THE INVENTION

According to the present invention, a full press-pack type semiconductor device comprises: (a) a semiconductor body having a semiconductor substrate, a first electrode formed in a central region of a first major surface of the semiconductor substrate, and a second electrode formed on a second major surface of the semiconductor substrate: (b) an insulating casing defining a cylindrical internal space having first and second openings, the semiconductor body being held in the internal space in such a direction that the first and second major surfaces are opposed to the first and second openings, respectively; (c) a first conductive distortion buffering plate held in the internal space of the casing, the first distortion buffering plate having a surface superimposed on the central region of the first major surface of the semiconductor body; (d) a first conductive external electrode having a base portion, a projecting portion formed integrally with the base portion, a ringlike recess formed in a region of the base portion which surrounds the projecting portion, and a contact surface defined by an end surface of the projecting portion, the projecting portion being inserted into the internal space of the casing from the first opening, the base portion being fixed to the casing in the first opening, with the contact surface superimposed on another surface of the first distortion buffering plate; (e) a second conductive distortion buffering plate held in the internal space of the casing, the second distortion buffering plate having a surface superimposed on the second major surface; (f) a second conductive external electrode held in the internal space of the casing and superimposed on the other surface of the second distortion buffering plate to be fixed to the casing; (g) a ring received in the ringlike recess of the first external electrode; and (h) an elastic means inserted between a bottom surface of the recess and the ring, the elastic means urging the ring to press against a peripheral region of the first major surface of the semiconductor body.

In the semiconductor device, the urging force of the elastic mechanism urges the ring to press against the peripheral region of the first major surface of the semiconductor body. This enables the semiconductor body to remain pressed against the second distortion buffering plate without fixing the semiconductor body to the first and second distortion buffering plates.

The ring is received in the ringlike recess of the first external electrode, and the elastic means lies between the bottom surface of the ringlike recess and the ring. The ring is pressed against the peripheral region of the semiconductor body by the urging force of the elastic means. The semiconductor body remains pressed against the second distortion buffering plate in the full press-pack type semiconductor device in which the semiconductor body is not bonded to the first and second distortion buffering plates. This provides for the positional fixation of the semiconductor body in the directions parallel to and perpendicular to the major surfaces of the semiconductor body. When the first and second external electrodes come up off the casing due to the vibration in transit of the device, the semiconductor body remains pressed against the second distortion buffering plate by the urging force of the elastic means, so that the semiconductor body is prevented from being damaged.

Preferably, the elastic means includes a ringlike elastic member disposed concentrically with the second distortion buffering plate, and the diameter of the second distortion buffering plate is not less than a dynamic effective diameter of the ringlike elastic member.

Since the second distortion buffering plate is present on the reverse side of part of the semiconductor body to which the urging force of the elastic means is applied, the supporting force of the second distortion buffering plate acts on the reverse side of the semiconductor substrate. This prevents the semiconductor body from deformation due to the urging force of the elastic means.

The second distortion buffering plate supports the urging force transmitted from the elastic means to the semiconductor body. The deformation of and damages to the semiconductor body are effectively prevented.

The present invention is also intended for a method of fabricating a semiconductor device. According to the present invention, the method comprises the steps of: (a) obtaining a semiconductor body having a semiconductor substrate, a first electrode formed in a central region of a first major surface of the semiconductor substrate, and a second electrode formed on a second major surface of the semiconductor substrate; (b) obtaining a first external electrode having a base portion, a projecting portion formed integrally with the base portion, a ringlike recess formed in a region of the base portion which surrounds the projecting portion, and a contact surface defined by a front end surface of the projecting portion; (c) obtaining a second conductive external electrode; (d) obtaining an insulating casing defining a cylindrical internal space having first and second openings; (e) holding the first external electrode in the internal space of the casing in such a direction that the base portion and the projecting portion are opposed to the first and second openings, respectively, and fixing the base portion to the casing in the first opening; (f) introducing an elastic means into the internal space of the casing from the second opening to hold the elastic means in the ringlike recess; (g) inserting a ring into the internal space of the casing from the second opening to dispose the ring on the elastic means in the ringlike recess; (h) introducing a first conductive distortion buffering plate into the internal space of the casing from the second opening to superimpose the first distortion buffering plate on the contact surface of the first external electrode; (i) introducing the semiconductor body, a second conductive distortion buffering plate and the second external electrode into the internal space of the casing from the second opening, the semiconductor body, in a peripheral region of the first major surface, being superimposed on the ring, a surface of the second distortion buffering plate, on one surface, being superimposed on the second major surface of the semiconductor body, the second external electrode being superimposed on another surface of the second distortion buffering plate; and (j) fixing the second external electrode to the casing in the second opening while the second external electrode is pressed against the first external electrode.

The semiconductor device having the foregoing characteristics is fabricated by the method of the present invention.

It is a primary object of the present invention to provide a full press-pack type semiconductor device which is capable of positional fixation of a semiconductor body in both vertical and lateral directions and which is capable of preventing damage to the semiconductor body where external electrodes come up off a casing due to vibration and the like.

It is another object of the present invention to provide a method of fabricating the semiconductor device which achieves the primary object.

These and other objects, features, aspects and advantages of the present invention will become more apparent from the following detailed description of the present invention when taken in conjunction with the accompanying drawings.

DESCRIPTION OF THE PREFERRED EMBODIMENTS

A. Construction of Device of Preferred Embodiment

Figure 1:
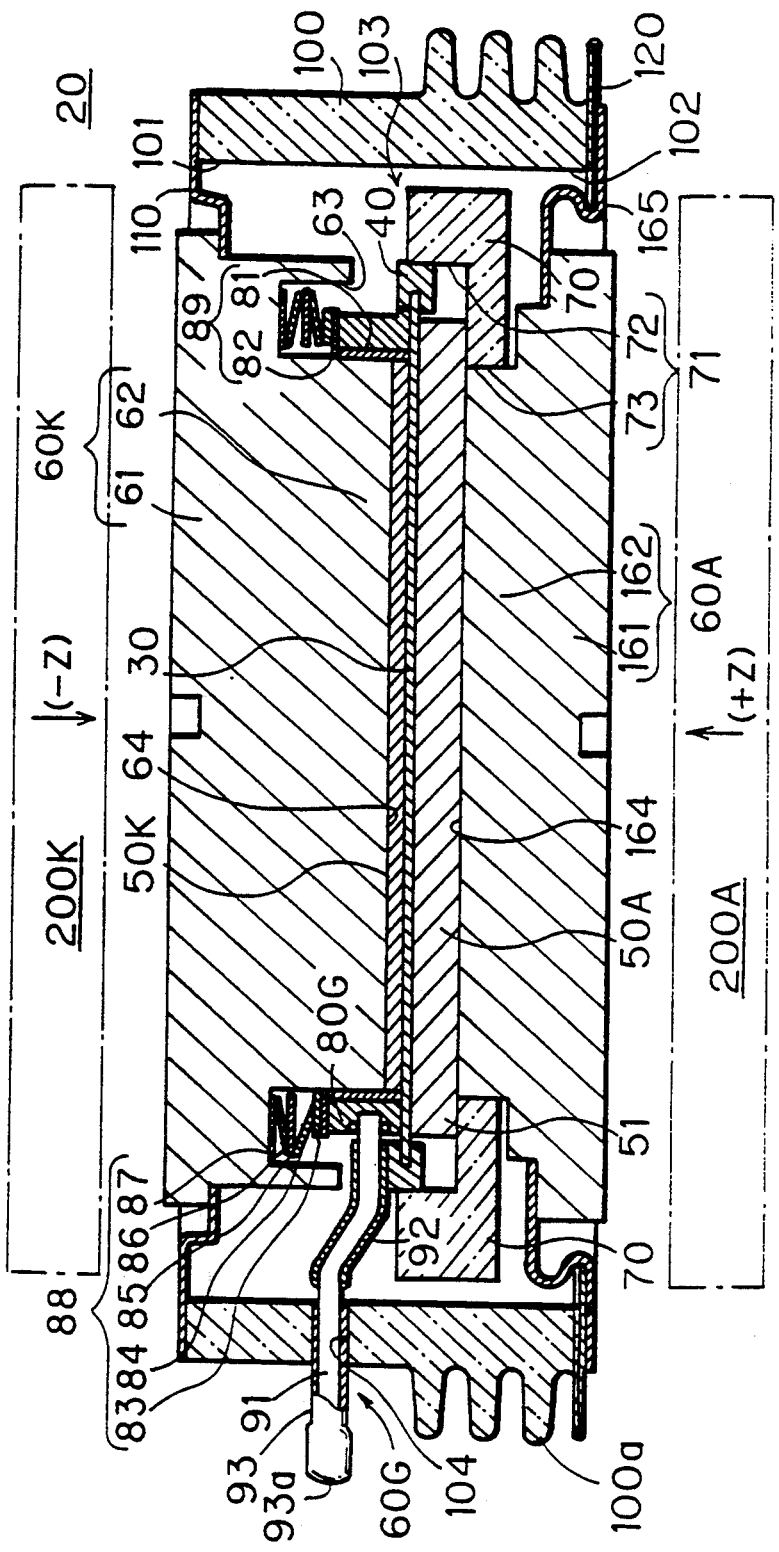
FIG. 1 is a cross-sectional view of a semiconductor device of a preferred embodiment according to the present invention.
Figure 2:
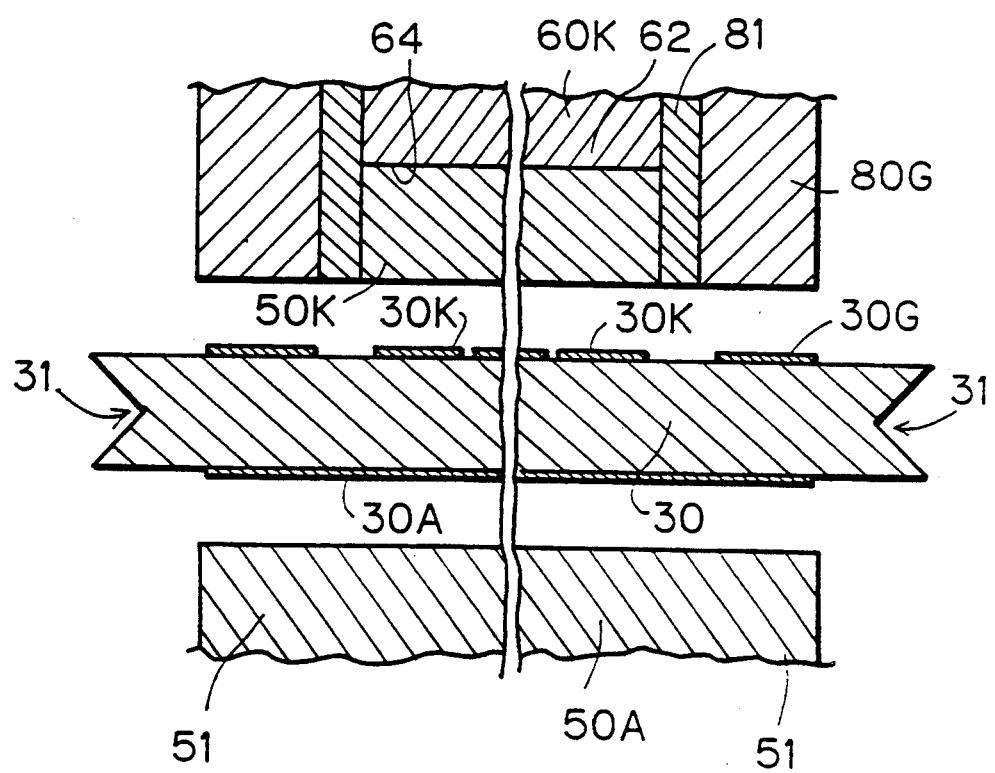
FIG. 2 is an exploded cross-sectional view of a major part of the semiconductor device of the preferred embodiment.

FIG. 1 is a cross-sectional view of a full press-pack type gate turn off thyristor (GTO) module 20 of a preferred embodiment according to the present invention. FIG. 2 is an exploded cross-sectional view of a major part of the thyristor module 20 of FIG. 1.

With reference to FIGS. 1 and 2, the thyristor module 20 comprises a semiconductor body 30. The semiconductor body 30 includes a 72 mm diameter discoid semiconductor substrate such as a silicon substrate in which a pnpn four-layer structure not shown is formed. As shown in FIG. 2, a cathode electrode 30K provided by the deposition of metal such as aluminium is formed in a central region of an upper major surface (first major surface) of the semiconductor body 30, and a gate electrode 30G provided by the deposition of metal such as aluminium is formed in an outer peripheral region of the upper major surface. An anode electrode 30A provided by the deposition of metal such as aluminium is formed on a lower major surface (second major surface) of the semiconductor body 30. Bevel cutting is done on the peripheral end face of the semiconductor body 30 on which a pn junction (not shown) is exposed, to provide a bevel structure 31. The bevel structure 31 decreases an electric field on the peripheral end face on which the pn junction is exposed.

A surface protective material 40 (of FIG. 1) made of silicon rubber or the like is applied to the peripheral edge of the semiconductor body 30 to cover the bevel structure 31 from the outside. The surface protective material 40 is disposed in ring form along the peripheral edge of the semiconductor body 30 concentrically with the semiconductor body 30.

A cathode distortion buffering plate (first distortion buffering plate) 50K made substantially of molybdenum, on its lower surface, is superimposed on the cathode electrode 30K or in the central region of the upper major surface of the semiconductor body 30. The cathode distortion buffering plate 50K is of a 60.5 mm diameter discoid configuration, the center line Thereof coinciding with the center line of The semiconductor body 30.

An external cathode electrode (first external electrode) 60K made of metal such as copper is disposed on the cathode distortion buffering plate 50K. The external cathode electrode 60K has a substantially discoid base portion 61 and a projecting portion 62 formed integrally with the base portion 61 in the center of the lower surface of the base portion 61. The projecting portion 62 of circular horizontal sectional configuration is formed opposite to the cathode electrode 30K. There is formed a ringlike groove portion (recess) 63 in a region of the base portion 61 which encloses and is adjacent to the projecting portion 62. A contact surface 64 specified by the front end surface of the projecting portion 62 is superimposed on the upper surface of the cathode distortion buffering plate 50K. The groove portion 63 is opposed to the gate electrode 30G.

A casing 100 made of ceramic such as alumina is of a cylindrical configuration having first and second openings 101 and 102. The casing 100 defines an internal space 103. Corrugations 100a are formed on the outer surface of the casing 100. The outer periphery of a flange 110 is fixedly brazed to the casing 100 in the first opening 101, and a flange 120 is fixedly brazed to the casing 100 in the second opening 102. The inner peripheral edge of the flange 110 is fixed to the outer peripheral lower surface of the base portion 61. The internal space 103 of the casing 100 accommodates the semiconductor body 30, cathode distortion buffering plate 50K, and base portion 61 and projecting portion 62 of the external cathode electrode 60K.

An anode distortion buffering plate (second distortion buffering plate) 50A made substantially of molybdenum, on its upper surface, is superimposed on the lower major surface of the semiconductor body 30 or on the lower surface of the anode electrode 30A in the internal space 103 of the casing 100. The anode distortion buffering plate 50A is a 4 mm thick discoid, the center line thereof coinciding with the center line of the semiconductor body 30. The diameter of the anode distortion buffering plate 50A is set to 66.0 mm, and an outer peripheral edge portion 51 of the anode distortion buffering plate 50A extends to the position corresponding to the gate electrode 30G.

An external anode electrode (second external electrode) 60A made of metal such as copper is disposed below the anode distortion buffering plate 50A. The external anode electrode 60A has a substantially discoid base portion 161 and a projecting portion 162 formed integrally with the base portion 161 in the center of the upper surface of the base portion 161. The projecting portion 162 of a circular horizontal sectional configuration is formed opposite to the anode electrode 30A.

A locating ring 70 is made substantially of teflon or silicon rubber, and the inner wall of the locating ring 70 defines a multistage engaging hole 71. The size and configuration of an upper half region (first region) 72 of the inner peripheral surface of the engaging hole 71 fit the outer peripheral configuration of the surface protective material 40, and the size and configuration of a lower half region (second region) 73 thereof fit the outer peripheral configuration of the projecting portion 162 of the external anode electrode 60A. The first region 72 of the engaging hole 71 is fitted over the surface protective material 40, and the second region 73 thereof is fitted over the projecting portion 162. This enables the semiconductor body 30 to be positioned radially (laterally in parallel with the major surfaces) relative to the external anode electrode 60A.

The inner periphery of a flange 165 is fixed to the outer peripheral upper surface of the base portion 161. The outer peripheral upper surface of the flange 165 is fixedly brazed to the lower surface of the flange 120 of the casing 100.

A ringlike gate extracting electrode 80G is disposed on the gate electrode 30G of the semiconductor body 30. The gate extracting electrode 80G is made of a material having a coefficient of thermal expansion approximate to that of the semiconductor body 30. In this preferred embodiment, the gate extracting electrode 80G is made substantially of metal such as molybdenum, the sizes of the internal and external diameters thereof being 61.7 mm and 67.0 mm, respectively. The gate extracting electrode 80G functions both as a supply passageway of a gate signal and as a ring for transmitting the elastic force of an elastic mechanism described later. An insulating sheet 81 is inserted between the gate extracting electrode 80G and external cathode electrode 60K.

An elastic means 88 is received in the groove portion 63 of the external cathode electrode 60K on the upper surface of the gate extracting electrode 80G. The elastic means 88 has alternately piled ringlike plain washers 83, 85, 87 and coned disc springs 84, 86. The first plain washer 83 is disposed on an insulating ring 82 which is placed on the upper surface of the gate extracting electrode 80G. The top plain washer 87 contacts the ceiling surface (bottom surface) of the groove portion 63. The gate extracting electrode 80G is pressed against the gate electrode 30G of the semiconductor body 30 by the urging force of the coned disc springs 84 and 86.

The diameter of the anode distortion buffering plate 50A is 66.0 mm as above described, which is larger than the 61.7 mm internal diameter of the gate extracting electrode 80G. Thus the outer peripheral edge portion 51 of the anode distortion buffering plate 50A is opposed to the gate extracting electrode 80G across the semiconductor body 30. The outer peripheral edge portion 51 functions as an urging force supporting portion for supporting the urging force of the elastic means 88 toward the semiconductor body 30 on the reverse side of the semiconductor body 30. In this preferred embodiment, the urging force of the coned disc springs 84 and 86 urges the gate extracting electrode 80G to press with a 60 kg force against the semiconductor body 30 supported by the urging force supporting portion 51.

An insulating member 89 composed of the insulating sheet 81 and insulating ring 82 electrically insulates the gate extracting electrode 80G from the external cathode electrode 60K and cathode distortion buffering plate 50K.

A gate lead wire 91 made of metal, at its one end, is fixedly brazed to the gate extracting electrode 80G. A half of the gate lead wire 91 is inserted into an insulating sleeve 92. The other half of the gate lead wire 91 is inserted into a metallic tube 93, and the end of the other half of the gate lead wire 91 is fixed to a leading edge portion 93a of the tube 93 by welding. The tube 93 is extracted outwardly of the casing 100 via a through hole 104 formed in the side wall of the casing 100, so that an external gate electrode 60G is formed.

B. Operations and Characteristics of Device of Preferred Embodiment

The gate turn off thyristor module 20 having such a construction, when used in a predetermined equipment, is inserted between anode and cathode members 200A and 200K of the predetermined equipment. The anode and cathode members 200A and 200K are urged in (+Z) and (−Z) directions, respectively, by an external spring not shown. The lower surface of the cathode member 200K comes into contact with the upper surface of the external cathode electrode 60K under pressure, and the upper surface of the anode member 200A comes into contact with the lower surface of the external anode electrode 60A under pressure. The pressures maintain electrical contact between the external cathode electrode 60K and cathode electrode 30K through the cathode distortion buffering plate 50K and electrical contact between the external anode electrode 60A and anode electrode 30A through the anode distortion buffering plate 50A. When a voltage is applied across the cathode and anode members 200K and 200A and a gate signal is applied to the external gate electrode 60G in this state, the thyristor module 20 is turned on and off.

While the thyristor module 20 is in operation, a large quantity of heat is generated. The heat causes a thermal stress to be generated between the external anode and cathode electrodes 60A, 60K and the semiconductor body 30. Both of the distortion buffering plates 50A and 50K buffer the thermal stress.

In the full press-pack type thyristor module 20, the semiconductor body 30 is pressed against the anode distortion buffering plate 50A by the urging force of the coned disc springs 84 and 86. The semiconductor body 30 remains pressed against the anode distortion buffering plate 50A when the external anode and cathode electrodes 60A and 60K come up off the casing 100, if within the stroke of the coned disc springs 84 and 86 in coming-up quantity, due to the vibration applied to the thyristor module 20 in transit of the device. The semiconductor body 30 does not vibrate individually when the device vibrates in transit. The semiconductor body 30 is prevented from colliding against the distortion buffering plates 50A and 50K, so that the damage to the semiconductor body 30 is prevented. Since the semiconductor body 30 is pressed against the anode distortion buffering plate 50A by the urging force of the coned disc springs 84 and 86, the semiconductor body 30 does not slip off the locating ring 70. The semiconductor body 30 is prevented from the position shifts in the vertical direction as well as in the lateral direction parallel to the major surfaces thereof. Excellent characteristics of the device are therefore maintained.

Since the pressing force of the gate extracting electrode 80G against the semiconductor body 30 by the coned disc springs 84 and 86 is supported by the urging force supporting portion 51 which is the outer peripheral edge portion of the anode distortion buffering plate 50A, the urging force of the coned disc springs 84 and 86 prevents the semiconductor body 30 from deformation and damage.

In this preferred embodiment, the internal and external diameters $D_i$ and $D_o$ of the gate extracting electrode 80G, and the diameter $D_A$ of the anode distortion buffering plate 50A are set as follows:

$D_i = 61.7$ mm
$D_o = 67.0$ mm
$D_A = 66.0$ mm

The pressure diameter $D_p$ of the coned disc springs 84 and 86 or a dynamic effective diameter of the elastic means 88 is as follows:

$D_p = 63.5$ mm

In general, the dynamic effective diameter of a ringlike elastic means the diameter of is a circle equivalently representative of the distribution of the elastic force generated by the elastic means. The dynamic effective diameter of a relatively narrow ringlike elastic member is approximately equal to the geometrical diameter thereof.

It is apparent from the foregoing equations that the following expression holds in this preferred embodiment:

$$D_i < D_p < D_A < D_o$$

The outer peripheral edge portion 51 of the anode distortion cushioning plate 50A effectively functions as the urging force supporting portion when at least the following expression holds:

$$D_p \leqq D_A$$

To sufficiently support the urging force of 60 kg applied to the semiconductor body 30 from the coned disc springs 84 and 86, it is preferable that the thickness of the anode distortion buffering plate 50A is set to 1 mm or more. In this preferred embodiment, the thickness of the anode distortion buffering plate 50A is set to 4 mm.

Since the semiconductor body 30 is pressed against the anode distortion buffering plate 50A by means of the elastic member composed of the coned disc spring 84 and 86 in this preferred embodiment, the whole device is formed in reduced size as described below.

When the semiconductor body 30 is held between the external anode and cathode electrode 60A and 60K under pressure by means of no elastic members but insulating bolts and nuts (e.g., teflon bolts and nuts), the sizes of the bolts and nuts must be large for sufficient pressure. This requires a large space for mounting the bolts and nuts in the external anode and cathode electrodes 60A and 60K, resulting in accordingly increasing size of the device.

Resins such as teflon have a relatively large coefficient of thermal expansion. When the temperature of the device rises, the insulating bolts expand and the pressure decreases, so that the characteristics of the device deteriorate.

In this preferred embodiment, the semiconductor body 30 is pressed against the anode distortion buffering plate 50A by means of the coned disc springs 84 and 86 which provide a sufficient pressing force with a smaller size than the bolts and nuts. Since the mounting space for the coned disc springs 84 and 85 is provided by the formation of the groove portion 63, the device is formed in reduced size. The thermal expansion of the coned disc springs 84 and 86, if generated, is absorbed by the stroke of the coned disc springs 84 and 86. The pressing force of the semiconductor body 30 toward the external anode electrode 60A therefore does not decrease.

Since the outer peripheral edge portion of the semiconductor body 30 is adapted to be pressed against the anode distortion buffering plate 50K, the pressing force is not concentrated locally, for example, in the central region of the semiconductor body 30. The entire second major surface of the semiconductor body 30 is uniformly pressed against the entire upper surface of the anode distortion buffering plate 50A. Sufficient pressing area and pressing force of the semiconductor body 30 against the anode distortion buffering plate 50A are ensured, so that excellent characteristics of the device are maintained.

In the application of the present invention to such a semiconductor device as the thyristor module 20 having a control electrode like the gate electrode 30G formed therein as in the preferred embodiment, the gate extracting electrode 80G for electrically extracting the control electrode outwardly also serves as the ring for pressing the semiconductor body 30 against the external anode electrode 60A. This application is effective in that the number of parts are reduced.

The thyristor module is adapted such that the distortion buffering plates 50A and 50K absorb the thermal stress generated in operation of the device. It is hence preferable that the distortion buffering plates 50A and 50K are made of a material having a coefficient of thermal expansion which is approximate to the coefficient of thermal expansion of silicon ($3.5 \times 10^{-6}/°C$.) forming the semiconductor body 30. Molybdenum, which is the material of the distortion buffering plates 50A and 50K in this preferred embodiment, has a coefficient of thermal expansion of $4.5 \times 10^{-6}/°C$.

A material, if other than molybdenum, which has a coefficient of thermal expansion of not more than twice the coefficient of thermal expansion of silicon is preferable as the material of the distortion buffering plates 50A and 50K. An example of such a material is tungsten (having a coefficient of thermal expansion of $4.9 \times 10^{-6}$ to $5.8 \times 10^{-6}/°C$.).

C. Method of Fabricating Device of Preferred Embodiment

Description will be given on a method of fabricating the thyristor module 20. In the method described below, the thyristor module 20 of FIG. 1 is turned upside down for the fabrication.

Figure 3:
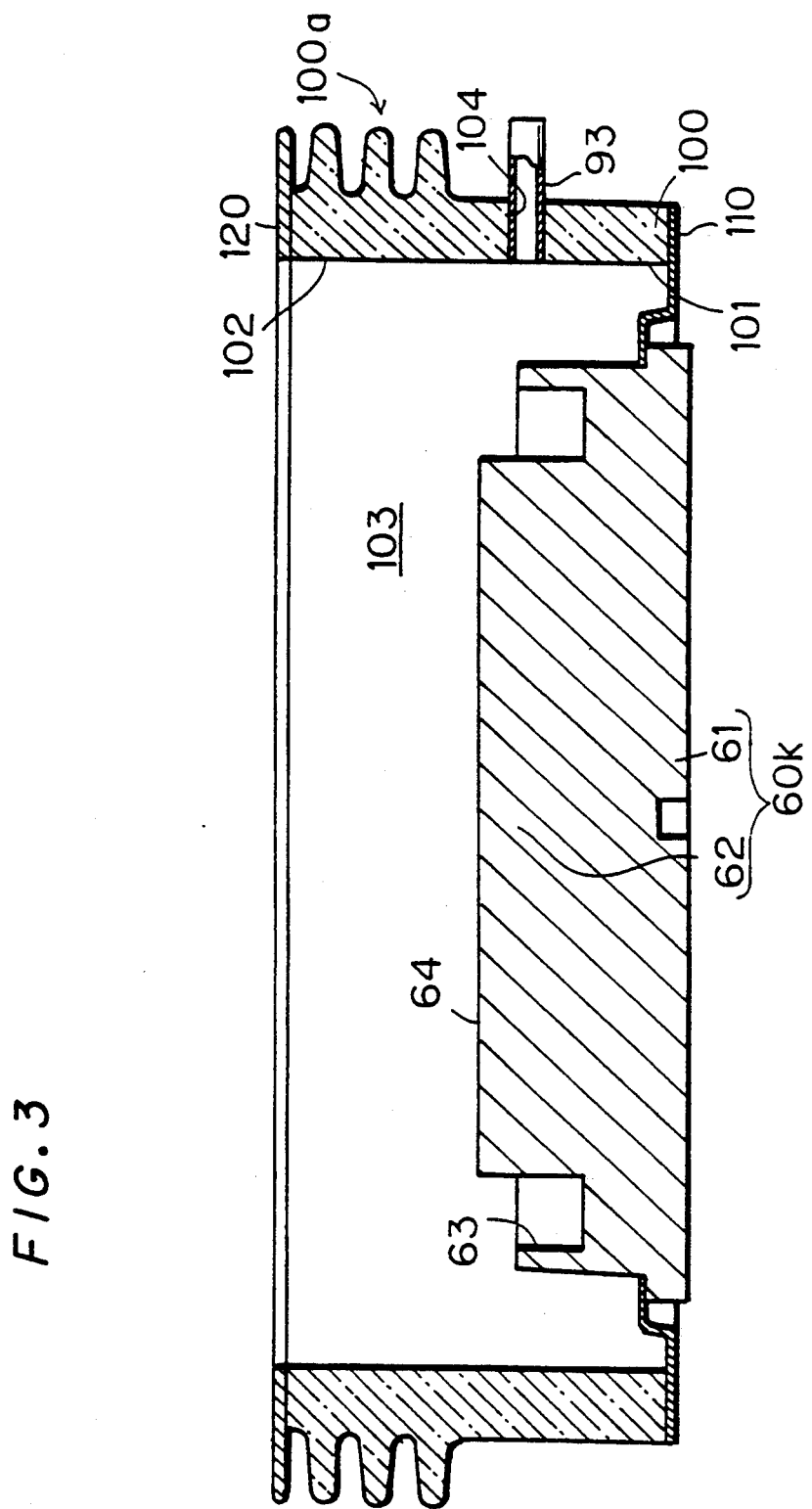
FIG. 3 is a cross-sectional view for illustrating a method of fabricating the semiconductor device of the preferred embodiment.
Figure 4:
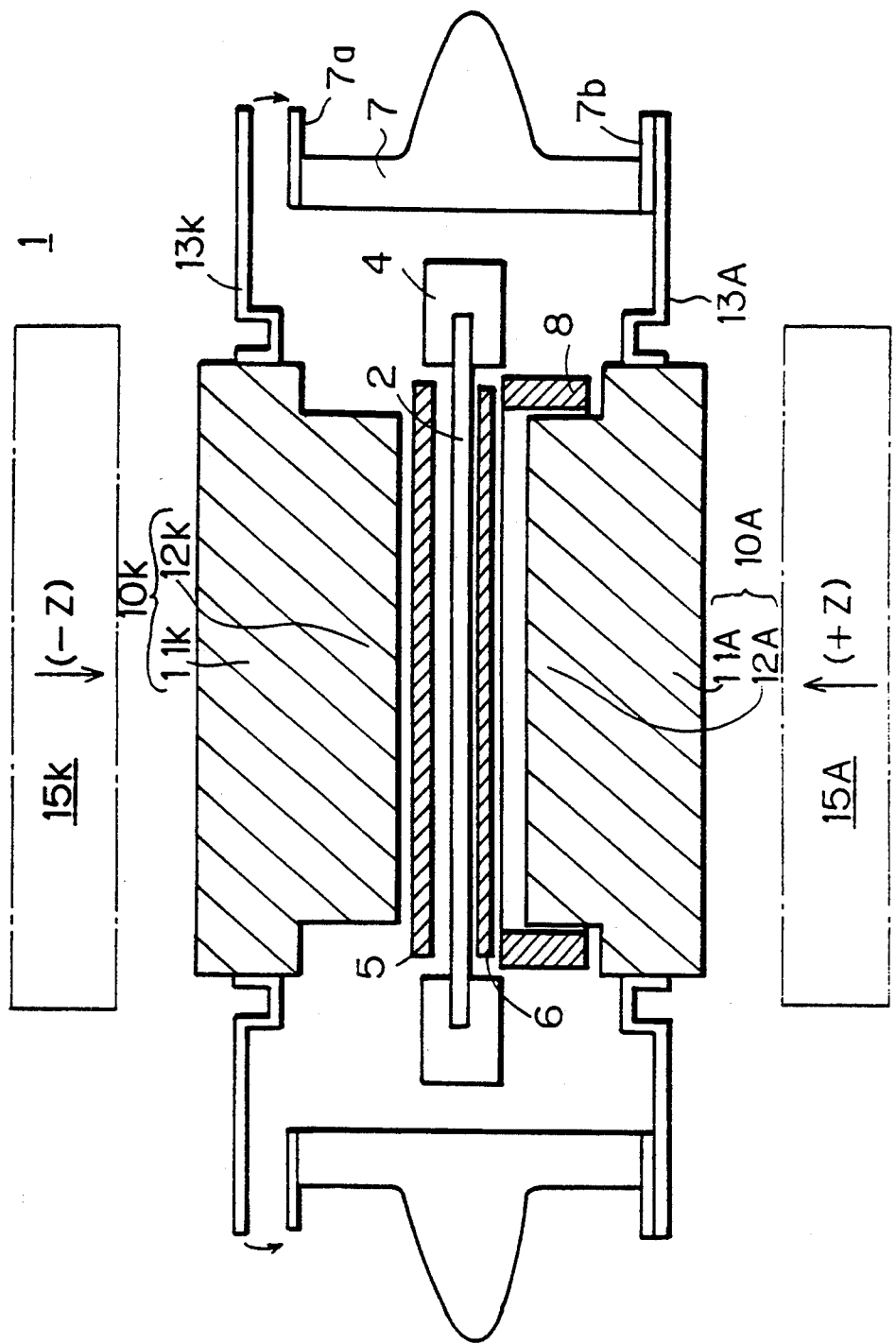
FIG. 4 is an exploded cross-sectional view of a conventional semiconductor device.

Referring to FIG. 3, the external cathode electrode 60K is fixedly brazed to the end of the casino 100 in the first opening 101 through the flange 110. The tube 93 is mounted in the through hole 104 of the casing 100.

The plain washer 87, coned disc spring 86, plain washer 85, coned disc spring 84, plain washer 83 and insulating ring 82 are introduced into the internal space 103 of the casing 100 from the second opening 102, and are received in the groove portion 63 of the external cathode electrode 60K in this order.

The gate extracting electrode 80G is introduced into the internal space 103 of the casino 100 from the second opening 102 and is disposed on the insulating ring 82. The insulating sheet 81 is inserted between the projecting portion 62 and gate extracting electrode 80G. The gate lead wire 91 mounted previously to the gate extracting electrode 80G is inserted into the tube 93. The insulting sheet 81 may be arranged around the projecting portion 62 before the plain washers 83, 85, 87 and coned disc springs 84, 86 are introduced into the groove portion 63.

The cathode distortion buffering plate 50K is inserted into the internal space 103 of the casing 100 from the second opening 102 and is disposed on the contact surface 64 of the external cathode electrode 60K. The cathode distortion buffering plate 50K may be disposed on the external cathode electrode 60K before the elastic mechanism 88 and gate extracting electrode 80G are mounted.

The succeeding processes are achievable in either a first or second mode described below. In the first mode, the semiconductor body 30, anode distortion buffering plate 50A, locating ring 70 and external anode electrode 60A are introduced into the internal space 103 in this order and are then assembled within the internal space 103. In the second mode, these members are assembled in advance, and the intermediate assembly is introduced into the internal space 103.

The details of the first mode will be discussed below.

Initially, the semiconductor body 30 to which the surface protective material 40 is attached is introduced into the internal space 103 of the casing 100 from the second opening 102, and is disposed on the cathode distortion buffering plate 50K and gate extracting electrode 80G. The anode distortion buffering plate 50A is introduced into the internal space 103 of the casing 100 from the second opening 102 and is disposed on the second major surface of the semiconductor body 30.

The locating ring 70 is introduced into the internal space 103 of the casing 100 from the second opening 102. The first region 72 of the engaging hole 71 of the locating ring 70 is fitted over the surface protective material 40.

The projecting portion 162 of the external anode electrode 60A to which the flange 165 is attached is introduced into the internal space 103 of the casing 100 from the second opening 102. The projecting portion 162 is fitted in the second region 73 of the engaging hole 71 of the locating ring 70.

The external anode electrode 60A is pushed in toward the external cathode electrode 60K against the urging force of the coned disc springs 84 and 86. This permits the coned disc springs 84 and 86 to accumulate the urging force. The projecting portion 162 of the external anode electrode 60A, anode distortion buffering plate 50A, semiconductor body 30, cathode distortion buffering plate 50K and projecting portion 62 of the external cathode electrode 60K are brought into contact with each other under pressure. In this state, the flange 165 is fixedly brazed to the flange 120 attached to the casing 100.

Finally, the leading edge portion of the gate lead wire 91 is welded to the leading edge portion 93a of the tube 93.

In the second mode, the intermediate assembly is provided outside the internal space 103 by putting together the semiconductor body 30, anode distortion buffering plate 50A, locating ring 70, external anode electrode 60A in this order. The intermediate assembly is introduced into the internal space 103 from the second opening 102 in such a direction that the semiconductor body 30 is opposed to the cathode distortion buffering plate 50K. The brazing of the flanges 165 and 120 and welding of the gate lead wire 91 in the second mode are the same as those in the first mode.

The thyristor module 20 shown in FIG. 1 is thus accomplished.

D. Modifications

Although the gate extracting electrode 80G is made of molybdenum in the preferred embodiment, the present invention is not limited to this. The gate extracting electrode 80G may be made substantially of tungsten.

The semiconductor body 30 having the pnpn four-layer structure is employed in the preferred embodiment. The present invention is, however, applicable to a semiconductor body having at least one pn junction formed therein. The present invention may be applied to such a semiconductor device as a diode module, for example. In this case, since the gate electrode is not formed, the members for extracting the gate electrode outwardly of the casing 100, e.g. the gate lead wire 91 and the like, are omitted. The gate extracting electrode 80G serves as the ring only for pressing. For fabrication of such a diode module, the process steps for mounting the members like the gate lead wire are unnecessary.

While the invention has been shown and described in detail, the foregoing description is in all aspects illustrative and not restrictive. It is therefore understood that numerous modifications and variations can be devised without departing from the scope of the invention.

What is claimed is:

1. A method of fabricating a semiconductor device, comprising the steps of:
   (a) obtaining a semiconductor body having a semiconductor substrate, a first electrode formed in a central region of a first major surface of said semiconductor substrate, and a second electrode formed on a second major surface of said semiconductor substrate;
   (b) obtaining a first external electrode having a base portion, a projecting portion formed integrally with said base portion, a ringlike recess formed in a region of said base portion which surrounds said projecting portion, and a contact surface defined by a front end surface of said projecting portion:
   (c) obtaining a second conductive external electrode;
   (d) obtaining an insulating casing defining a cylindrical internal space having first and second openings;
   (e) holding said first external electrode in said internal space of said casing in such a direction that said base portion and said projecting portion are opposed to said first and second openings, respectively, and fixing said base portion to said casing in said first opening;
   (f) introducing an elastic means into said internal space of said casing from said second opening to hold said elastic means in said ringlike recess;
   (g) inserting a ring into said internal space of said casing from said second opening to dispose said ring on said elastic means in said ringlike recess;
   (h) introducing a first conductive distortion buffering plate into said internal space of said casing from said second opening to superimpose said first distortion buffering plate on said contact surface of said first external electrode;

(i) introducing said semiconductor body, a second conductive distortion buffering plate and said second external electrode into said internal space of said casing from said second opening, said semiconductor body, in a peripheral region of said first major surface, being superimposed on said ring, a surface of said second distortion buffering plate being superimposed on said second major surface of said semiconductor body, said second external electrode being superimposed on another surface of said second distortion buffering plate; and (j) fixing said second external electrode to said casing in said second opening while said second external electrode is pressed against said first external electrode.

2. The method of claim 1,
wherein said elastic means includes a ringlike elastic member,
wherein the diameter of said second distortion buffering plate is not less than a dynamic effective diameter of said ringlike elastic member, and
wherein said step (i) includes the step of (i-1) arranging said second distortion buffering plate concentrically with said ringlike elastic member.

3. The method of claim 2,
wherein said semiconductor body further comprises a control electrode in said peripheral region of said first major surface of said semiconductor body;
wherein said ring is composed of a conductive member,
wherein there is formed a through hole in said casing, and
wherein said step (g) includes the steps of:
 (g-1) providing said ring around said projecting portion of said first external electrode; and
 (g-2) inserting an insulating member between said projecting portion and said ring,
said method further comprising the steps of:
(k) electrically connecting one end of a control lead wire to said ring; and
(l) inserting said control lead wire into said through hole.

4. The method of claim 3,
wherein said step (f) includes the steps of:
 (f-1) obtaining a ringlike spring as said ringlike elastic member; and
 (f-1) holding said spring in said ringlike recess.

* * * * *